(12) United States Patent
Chang et al.

(10) Patent No.: US 9,520,389 B1
(45) Date of Patent: Dec. 13, 2016

(54) SILICON-CONTROLLED RECTIFIER AND AN ESD CLAMP CIRCUIT

(71) Applicants: National Chiao Tung University, Hsinchu (TW); Himax Technologies Limited, Tainan (TW)

(72) Inventors: Chun-Yen Chang, Hsinchu (TW); Shiang-Shiou Yen, Hsinchu (TW); Shao-Chin Chang, Tainan (TW); Che-Wei Chiang, Tainan (TW)

(73) Assignees: National Chiao Tung University, Hsinchu (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 14/793,598

(22) Filed: Jul. 7, 2015

(51) Int. Cl.
| | | |
|---|---|---|
| *H01L 27/08* | (2006.01) |
| *H01L 27/02* | (2006.01) |
| *H01L 21/8234* | (2006.01) |
| *H01L 49/02* | (2006.01) |
| *H01L 29/74* | (2006.01) |
| *H01L 29/10* | (2006.01) |
| *H01L 29/06* | (2006.01) |

(52) U.S. Cl.
CPC ....... *H01L 27/0262* (2013.01); *H01L 27/0251* (2013.01); *H01L 27/0288* (2013.01); *H01L 28/20* (2013.01); *H01L 29/0649* (2013.01); *H01L 29/1095* (2013.01); *H01L 29/74* (2013.01)

(58) Field of Classification Search
CPC .............. H01L 27/0262; H01L 27/0251; H01L 27/0288; H01L 29/74; H01L 29/1095; H01L 29/0649; H01L 28/20
USPC .......... 257/124, 133, 140, 173, 355, 360,257/E27.052, E27.062, E29.225, 260/E29.342,257/E21.334, E21.695; 361/56, 91.1, 91.3; 438/135, 134, 140
See application file for complete search history.

(56) References Cited

U.S. PATENT DOCUMENTS

| | | | | |
|---|---|---|---|---|
| 7,394,133 B1* | 7/2008 | Vashchenko | ........ | H01L 27/0262 257/355 |
| 2013/0285113 A1* | 10/2013 | Edwards | ............. | H01L 27/0262 257/133 |
| 2014/0054642 A1* | 2/2014 | Edwards | ............. | H01L 27/0262 257/124 |
| 2014/0138735 A1* | 5/2014 | Clarke | ................ | H01L 29/0692 257/124 |
| 2015/0221629 A1* | 8/2015 | Besse | ................... | H01L 29/7436 257/140 |

* cited by examiner

*Primary Examiner* — Dao H Nguyen
(74) *Attorney, Agent, or Firm* — Donald E. Stout; Stout, Uxa & Buyan, LLP

(57) ABSTRACT

A silicon-controlled rectifier (SCR) includes a first-type field, a second-type first field and a second-type second field disconnectedly formed in a first-type well; an entire first-type doped region formed within the first-type field; a segmented second-type doped region formed within the second-type first field; and a segmented first-type doped region formed within the second-type second field.

16 Claims, 12 Drawing Sheets

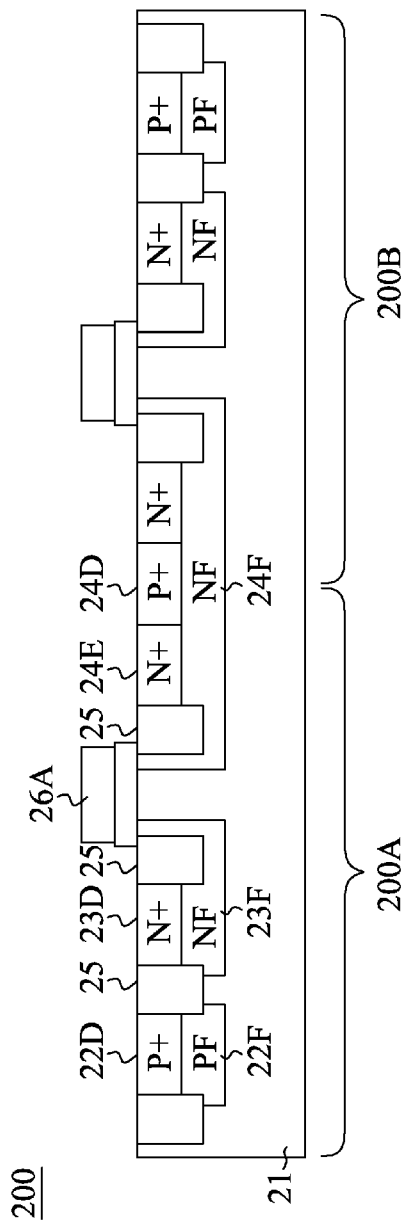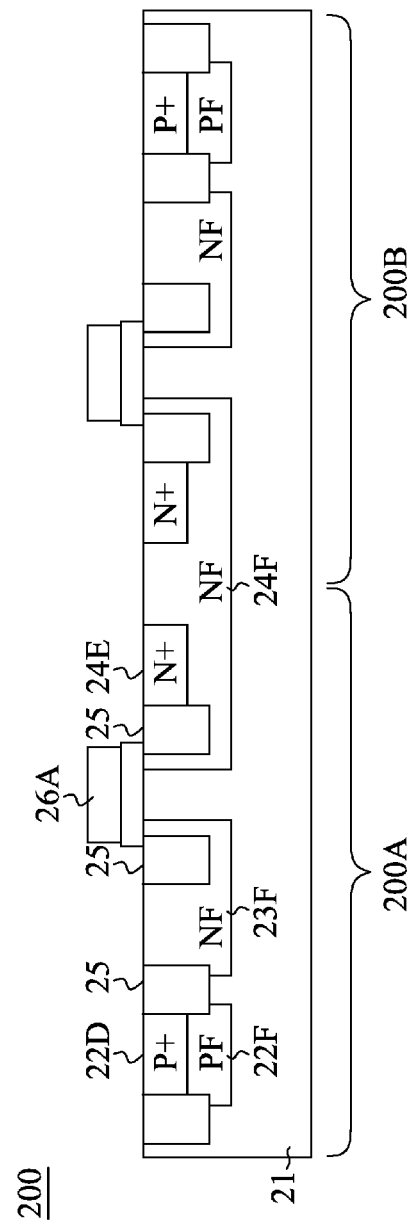
FIG.2B
FIG.2C

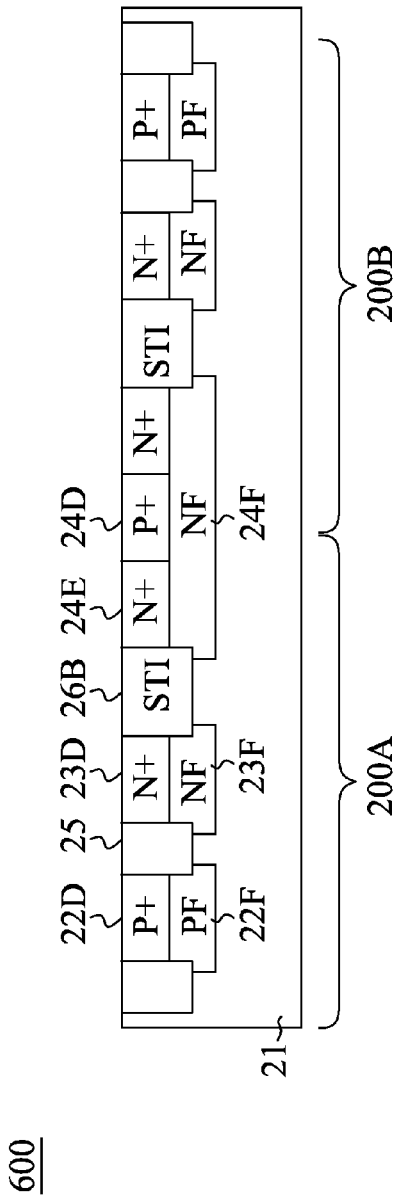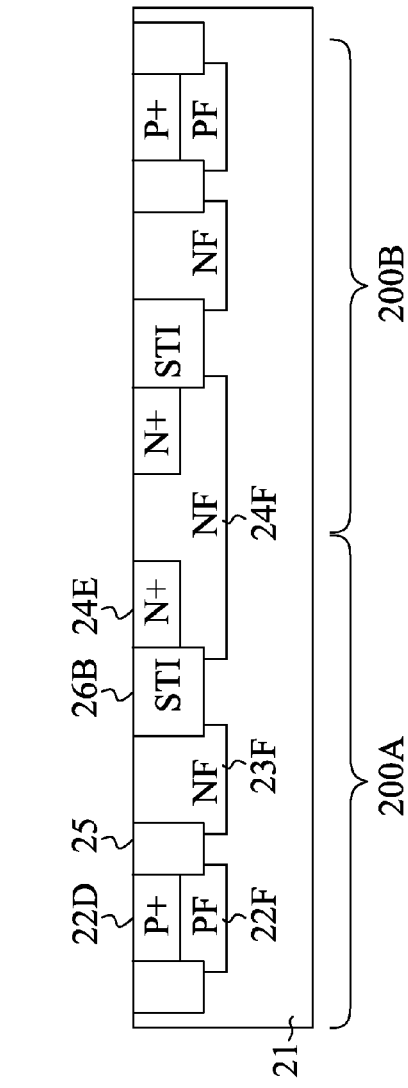
FIG.6B
FIG.6C

900

1000

1100

SILICON-CONTROLLED RECTIFIER AND AN ESD CLAMP CIRCUIT

BACKGROUND OF THE INVENTION

1. Field of the Invention

The present invention generally relates to silicon-controlled rectifiers (SCRs), and more particularly to SCRs with increased holding voltage and to polysilicon resistance triggered stack SCRs.

2. Description of Related Art

A silicon-controlled rectifier (SCR) is a solid state current controlling device and a bidirectional device adopted as an electrostatic discharge (ESD) device. FIG. 1 shows a current-voltage curve of a typical SCR concerning ESD in an integrated circuit (IC). In general, a trigger voltage should be less than a safe voltage $V_{safe}$, which assures no breakdown to an oxide layer in electrostatic discharge. On the other hand, a holding voltage should be higher than maximum rated device voltage $V_{ddmax}$, which assures no latch-up to a normally operated device.

Some schemes have been proposed to increase the holding voltage in order to prevent latch-up. However, those schemes may incur current crowding and decrease the current value at the second breakdown, thereby sacrificing ESD capability. Moreover, those schemes may disadvantageously increase the trigger voltage.

When the conventional SCRs are connected in series, the holding voltage and the trigger voltage become proportional to the amount of the SCRs. A scheme has been proposed by using a guard ring. However, the trigger voltage may increase to some extent when the amount of the connected SCRs increases.

A need has thus arisen to propose a novel scheme to overcome the disadvantages of the conventional SCRs.

SUMMARY OF THE INVENTION

In view of the foregoing, it is an object of the embodiment of the present invention to provide a novel structure of a silicon-controlled rectifier (SCR) with substantially increased holding voltage. One embodiment provides polysilicon resistance triggered stack SCRs without increasing the trigger voltage.

According to one embodiment, a silicon-controlled rectifier (SCR) includes a first-type field, a second-type first field, a second-type second field, an entire first-type doped region, a segmented second-type doped region and a segmented first-type doped region. The first-type field, the second-type first field and the second-type second field are formed in a first-type well, and are disconnected. The entire first-type doped region is formed within the first-type field; the segmented second-type doped region is formed within the second-type first field; and the segmented first-type doped region is formed within the second-type second field. Ion dose of the entire first-type doped region is greater than ion dose of the first-type field, ion dose of which is further greater than ion dose of first-type well. Ion dose of the segmented second-type doped region is greater than ion dose of the second-type first field, ion dose of which is further greater than ion dose of the first-type well. Ion dose of the segmented first-type doped region is greater than ion dose of the second-type second field, ion dose of which is further greater than ion dose of the first-type well.

BRIEF DESCRIPTION OF THE DRAWINGS

FIG. 2B shows a cross-sectional view of the SCR of FIG. 2A along a section line 2B-2B';

FIG. 2C shows a cross-sectional view of the SCR of FIG. 2A along a section line 2C-2C';

FIG. 6B shows a cross-sectional view of the SCR of FIG. 6A along a section line 6B-6B';

FIG. 6C shows a cross-sectional view of the SCR of FIG. 6A along a section line 6C-6C';

DETAILED DESCRIPTION OF THE INVENTION

Figure 2A:
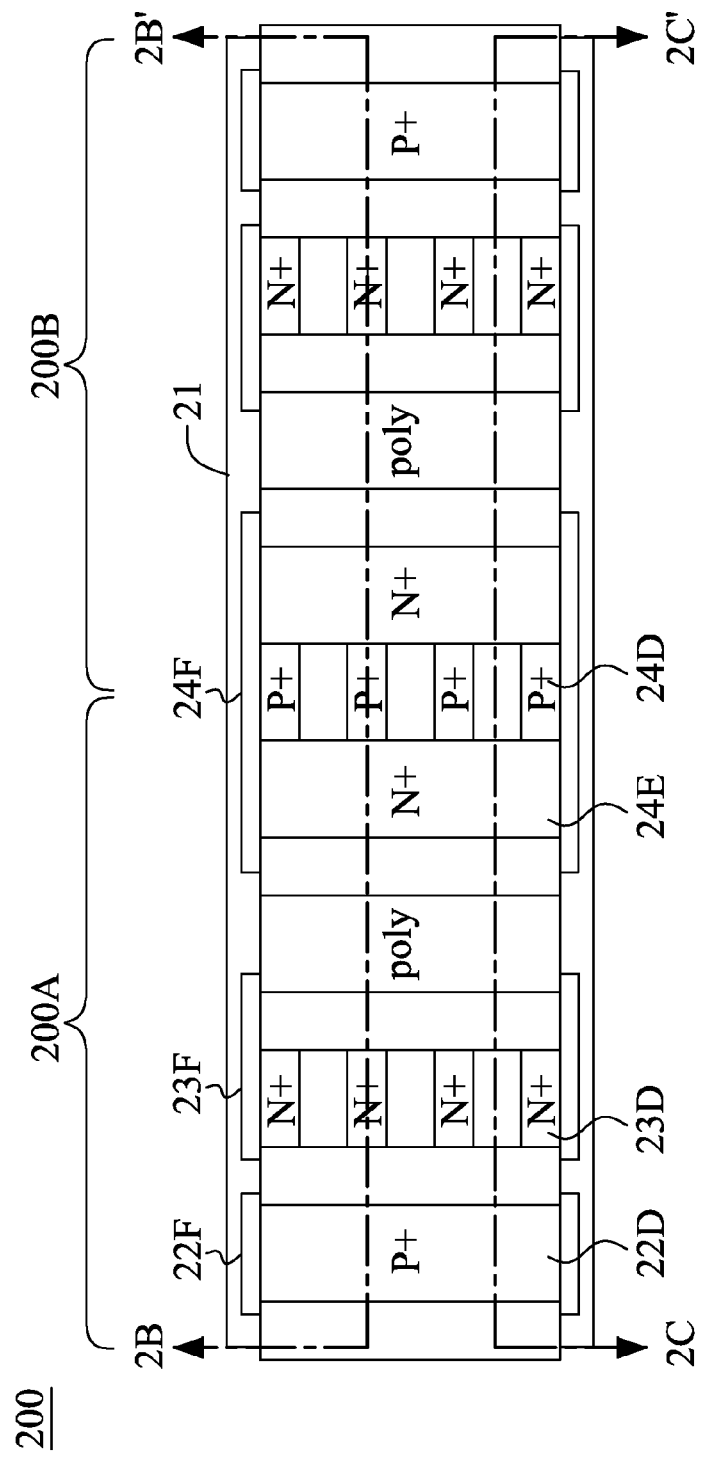
FIG. 2A shows a top view of an SCR according to a first embodiment of the present invention.

FIG. 2A shows a top view of a silicon-controlled rectifier (SCR) 200 according to a first embodiment of the present invention, FIG. 2B shows a cross-sectional view of the SCR 200 of FIG. 2A along a section line 2B-2B', and FIG. 2C shows a cross-sectional view of the SCR 200 of FIG. 2A along a section line 2C-2C'.

The SCR 200 of the embodiment includes at least a unit cell 200A. As shown in FIG. 2A, the SCR 200 may include an additional unit cell 200B that mirrors the unit cell 200A. The following description refers to the unit cell 200A while description of the additional unit cell 200B is omitted for brevity.

In the embodiment, a first-type well 21, for example, a p-type well is provided. A first-type field 22F, a second-type first field 23F and a second-type second field 24F are formed in the first-type well 21. In the embodiment as exemplified in FIG. 2A/2B/2C, the first-type refers to p-type, and the second-type refers to n-type. The first-type field 22F, the second-type first field 23F and the second-type second field 24F are disposed in sequence latitudinally. Moreover, the first-type field 22F, the second-type first field 23F and the second-type second field 24F are disconnected. A polysilicon gate ("poly gate" for short) 26A is further formed on the first-type well 21, and is disposed between the second-type first field 23F and the second-type second field 24F.

Figure 3:
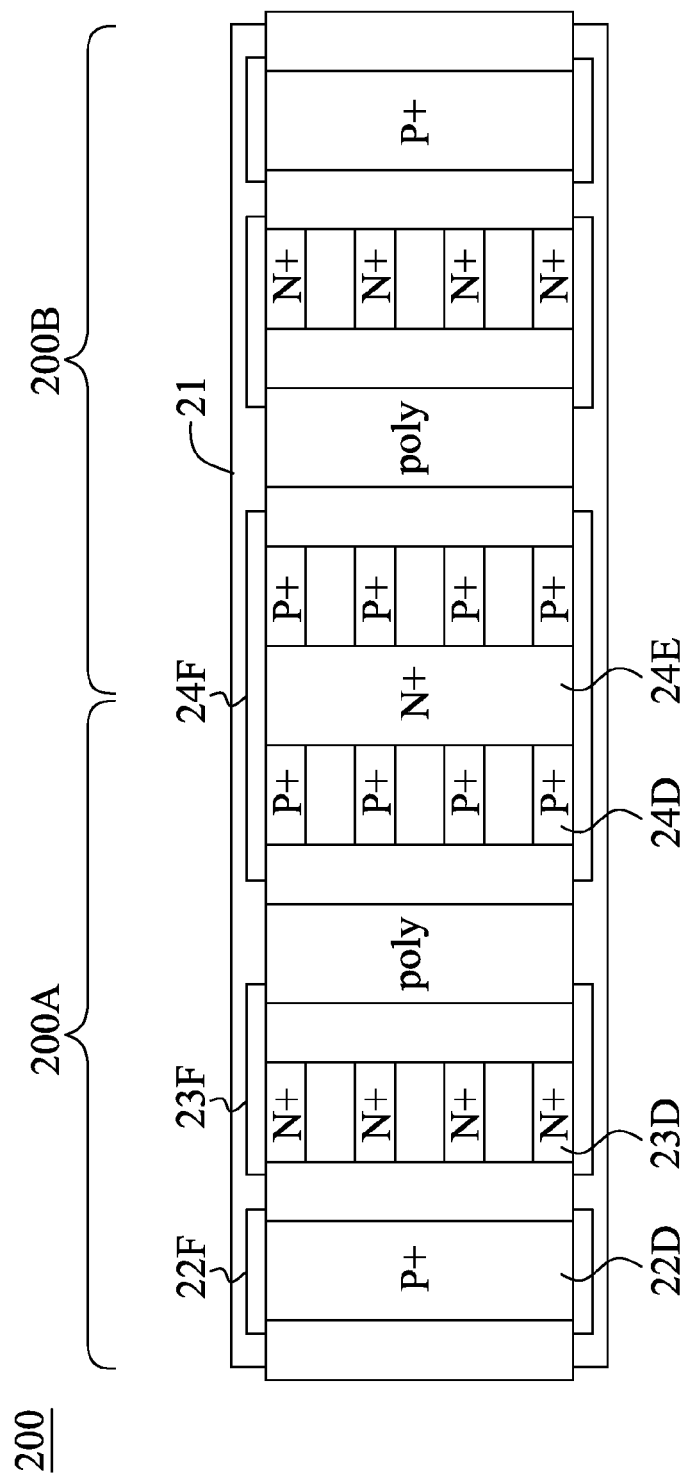
FIGS. 3, 4A, 4B and 5 show top views of an SCR according to alternative embodiments of the present invention.

Still referring to FIG. 2A/2B/2C, an entire (or non-segmented) first-type doped (e.g., P+) region 22D is formed within the first-type field 22F, a segmented second-type doped (N+) region 23D is formed within the second-type first field 23F, and a segmented first-type doped (e.g., P+) region 24D is formed within the second-type second field 24F. An entire second-type doped (e.g., N+) region 24E is formed within the second-type second field 24F. In one exemplary embodiment, the entire second-type doped region 24E is disposed between the segmented second-type doped region 23D and the segmented first-type doped region 24D, and is connected with the segmented first-type doped region 24D. In another exemplary embodiment as shown in FIG. 3, the segmented first-type doped region 24D is disposed between the segmented second-type doped region 23D and the entire second-type doped region 24E.

According to one aspect of the embodiment, ion dose of the entire first-type doped region 22D is greater than ion dose of the first-type field 22F, ion dose of which is greater than ion dose of the first-type well 21. Similarly, ion dose of the segmented second-type doped (N+) region 23D is greater than ion dose of the second-type first field 23F, ion dose of which is greater than ion dose of the first-type well 21. Similarly, ion dose of the segmented first-type doped region 24D is greater than ion dose of the second-type second field 24F, ion dose of which is greater than ion dose of the first-type well 21. Similarly, ion dose of the entire second-type doped region 24E is greater than ion dose of the second-type second field 24F, ion dose of which is greater than ion dose of the first-type well 21.

Figure 4A:
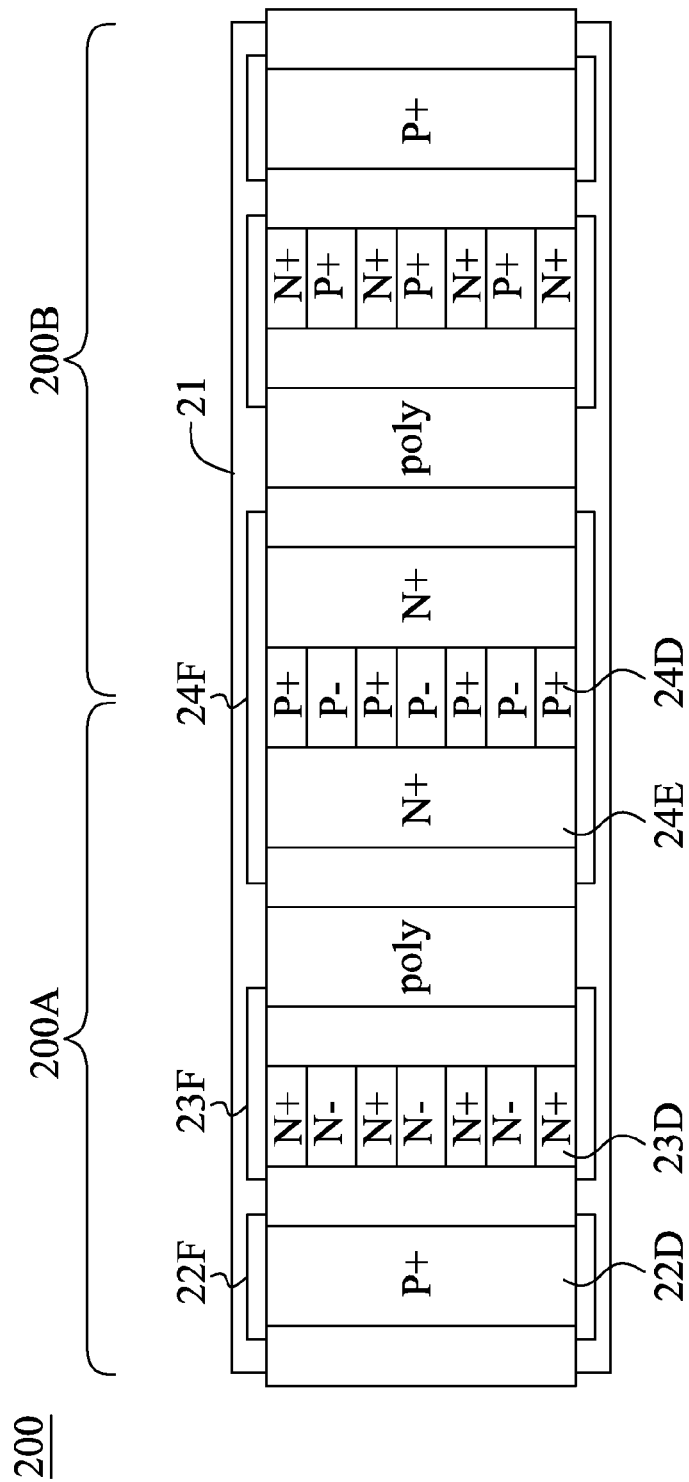
Figure 4B:
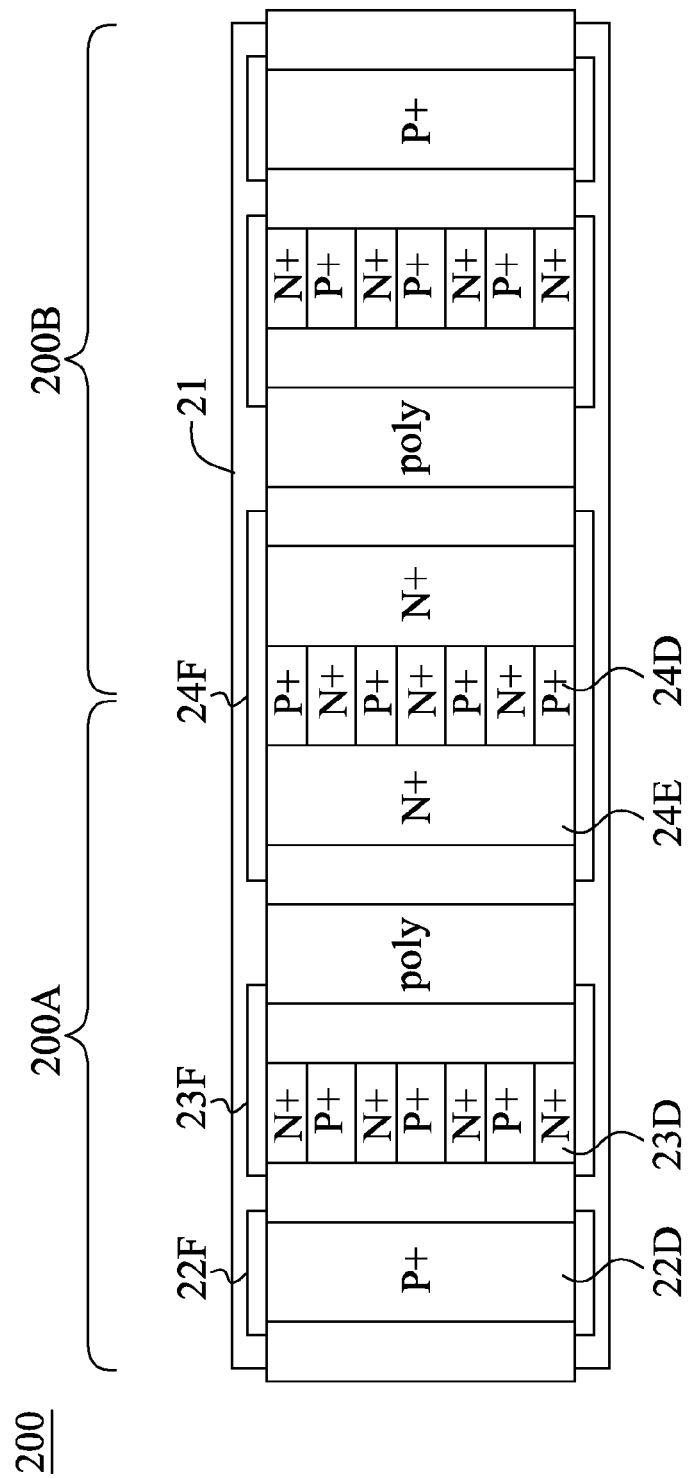
Figure 5:
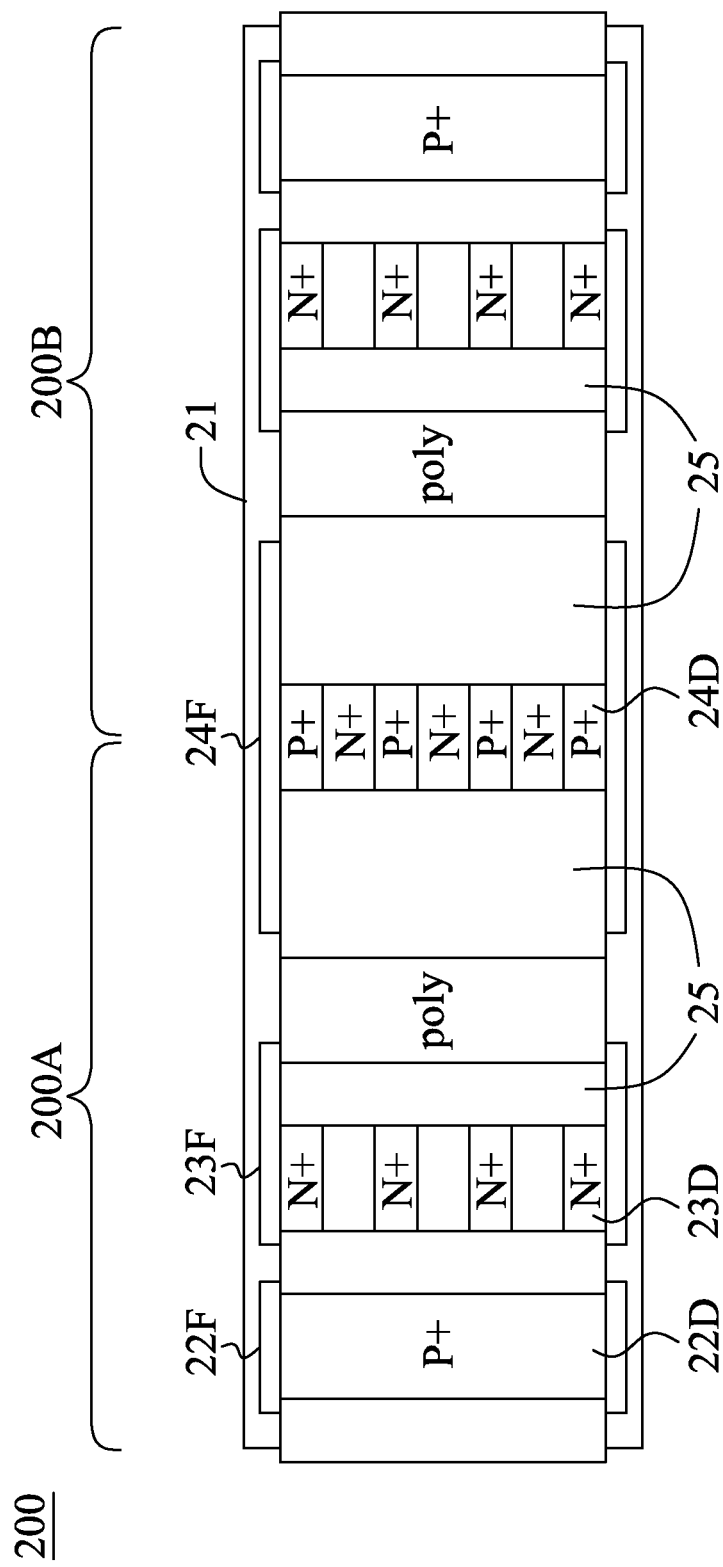

In the embodiment, the term "segmented" means that the doped region, for example, the segmented second-type doped region 23D, is composed of a plurality of doped sub-regions that are disposed longitudinally and are separated from each other. In one exemplary embodiment, the doped sub-regions are separated by other sub-regions with ion dose of the second-type first field 23F. In another exemplary embodiment, the doped sub-regions are separated by lightly-doped sub-regions doped with same type as shown in FIG. 4A. For example, ion dose of the lightly-doped sub-region N− is less than ion dose of the segmented second-type doped (N+) region 23D, but is greater than ion dose of the second-type first field 23F. In a further exemplary embodiment, the doped sub-regions are separated by other doped sub-regions doped with opposite type as shown in FIG. 4B. In this example, if the first-type doped sub-regions of the segmented first-type doped region 24D are separated by other second-type doped sub-regions, the entire second-type doped region 24E may be omitted and replaced with isolation region 25, as shown in FIG. 5. In a further exemplary embodiment in between, some of the doped sub-regions are separated by other sub-regions with ion dose of the second-type first field 23F, while the other of the doped sub-regions are separated by other doped sub-regions doped with opposite type.

Figure 6A:
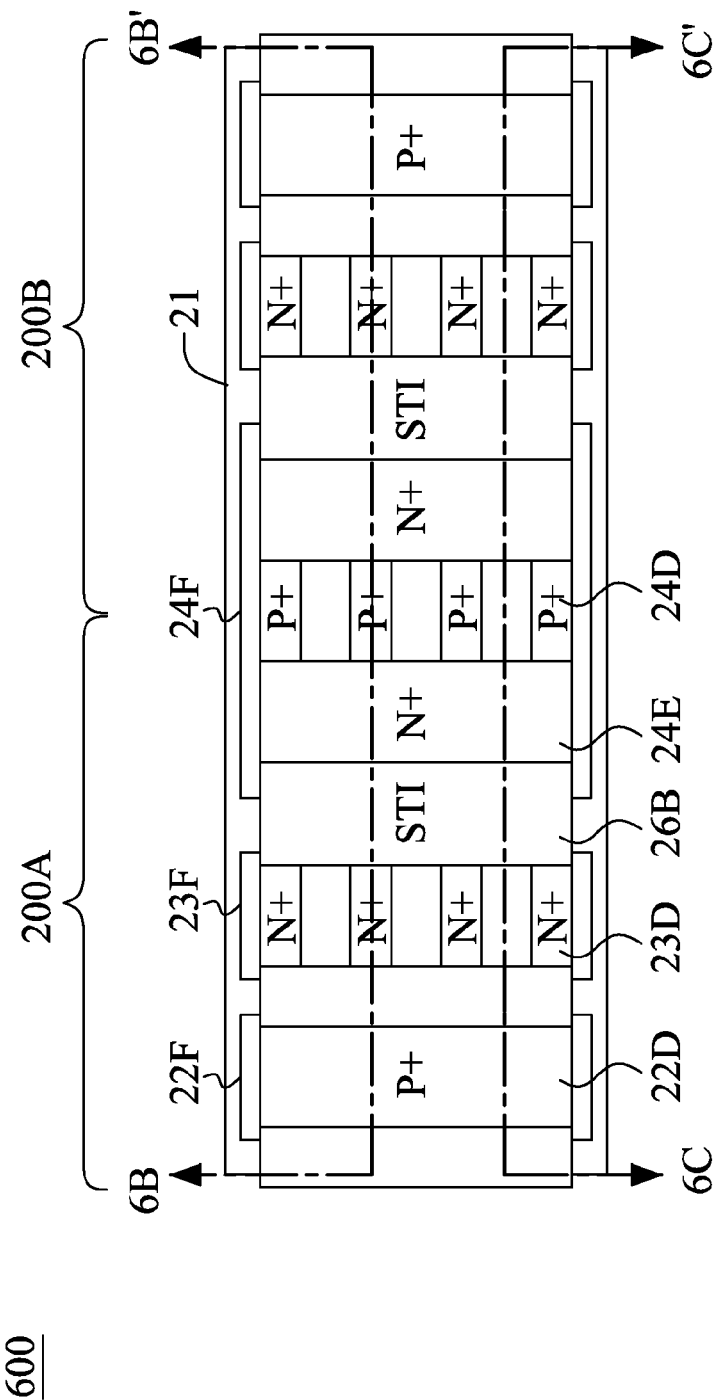
FIG. 6A shows a top view of an SCR according to a second embodiment of the present invention.

FIG. 6A shows a top view of a silicon-controlled rectifier (SCR) 600 according to a second embodiment of the present invention, FIG. 6B shows a cross-sectional view of the SCR 600 of FIG. 6A along a section line 6B-6B', and FIG. 6C shows a cross-sectional view of the SCR 600 of FIG. 6A along a section line 6C-6C'.

The second embodiment is similar to the first embodiment with the exception that the poly gate 26A is replaced with a shallow trench isolation (STI) 26B disposed in the first-type well 21. Compared with the first embodiment, the holding voltage and the trigger voltage in the second embodiment are reduced a little.

According to the embodiments presented above, the maximum electric field and the maximum current density may be separated due to the use of the variety of fields 22F, 23F and 24F, thereby decreasing joule heat caused by current crowding effect. Therefore, the current value at the second breakdown may be maintained even N+ or P+ area is less than the conventional SCR, therefore substantially increasing the holding voltage.

Figure 7:
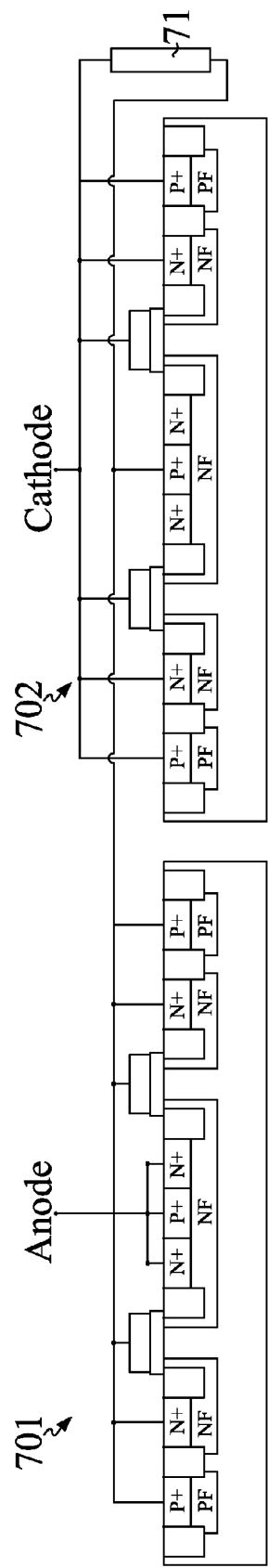
FIG. 7 shows a cross-sectional view of polysilicon resistance triggered stack SCRs.

FIG. 7 shows a cross-sectional view of polysilicon resistance triggered stack SCRs composed of multiple (two in this example) SCRs 200 of the first embodiment connected in series. Although two SCRs are exemplified in FIG. 7, it is appreciated that more SCRs may be connected in the same manner. As shown in FIG. 7, a polysilicon region 71 is connected between a cathode of a first SCR 701 and an anode of a second SCR 702, and is utilized to trigger the second SCR 702. The trigger voltage may be adjusted according to resistance value of the polysilicon region 71, such that the holding voltage may be proportional to the amount of the SCRs without increasing the trigger voltage. It is noted that the polysilicon region 71 is an element that is specifically manufactured in the SCR, rather than parasitic resistance due to or possessed by conventional guard rings.

Figure 8:
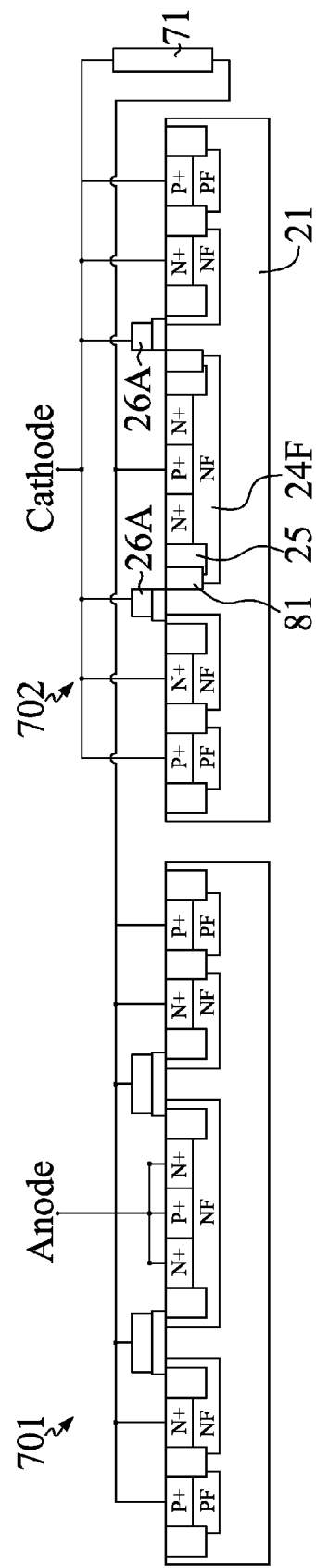
FIG. 8 shows an embodiment alternative to FIG. 7.

FIG. 8 shows an embodiment alternative to FIG. 7. Specifically, an additional first-type doped region 81 may be further formed and adjacent to the poly gate 26A, and be overlapped with the second-type second field 24F and the first-type well 21 in order to accelerate triggering.

Figure 1:
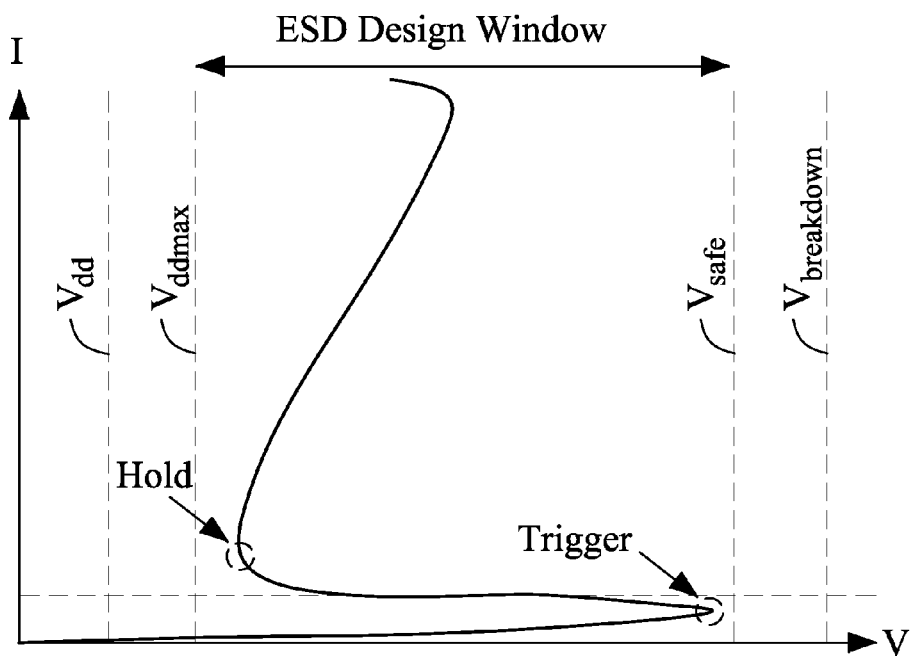
FIG. 1 shows a current-voltage curve of a typical silicon-controlled rectifier (SCR)

A silicon-controlled rectifier (SCR) may be adopted as an electrostatic discharge (ESD) device connected the input/output pad to $V_{DD}/V_{SS}$ terminal or function as the ESD power clamp between $V_{DD}$ and $V_{SS}$ terminals of an integrated circuit (IC). In order to accelerate the trigger of the SCR, a trigger voltage ($V_t$) of the SCR should be as low as possible. Upon conduction, the resistance of the SCR changes from high to low, and a voltage across the SCR becomes low. In order to prevent latch-up between $V_{DD}$ to $V_{SS}$, a holding voltage ($V_h$) of the SCR should be as high as possible. Accordingly, the distance between the trigger voltage and the holding voltage (i.e., $V_t-V_h$), commonly called the ESD design window (FIG. 1), should be as low as possible.

Figure 9:
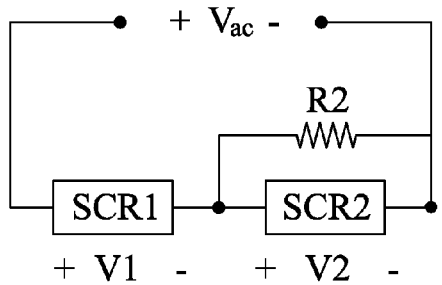
FIG. 9 shows an ESD clamp circuit implemented by stacking two SCRs according to one embodiment of the present invention.

FIG. 9 shows an ESD clamp circuit 900 implemented by stacking two SCRs, that is, a first SCR (SCR 1) and a second SCR (SCR 2). The ESD clamp circuit 900 also includes a shunt resistor ($R_2$ in this example) associated and connected in parallel with the second SCR. In practice, the first SCR should satisfy a basic requirement that $V_{BD}>1.2V_{DD}$ ($V_{BD}$ is a breakdown voltage and $V_{DD}$ is power supply) such that low leakage can be maintained in a normal operation (i.e., non-ESD event). Suitable SCRs for such basic requirement are lateral SCR (LSCR), modified lateral SCR (MLSCR), and low-voltage triggering SCR (LVTSCR). Details of such SCRs may be referred to "Electrostatic Discharge Protection Circuits in CMOS IC's Using the Lateral SCR Devices: An Overview," entitled to Ming-Dou Ker, Electronics, Circuits and Systems, 1998 IEEE, the disclosure of which is incorporated herein by reference.

To ensure that the second SCR can be triggered immediately after the conduction of the first SCR, a second SCR with low trigger voltage should be utilized. Suitable SCRs with low trigger voltage are MLSCR and LVTSCR.

Upon conduction of the first SCR, a current will flow through the shunt resistor $R_2$ associated the second SCR. As a voltage across the shunt resistor $R_2$ becomes higher than the trigger voltage ($V_{t,SCR2}$) of the second SCR, the second SCR is thus conducted and the resistance of the SCR changes from high to low. Accordingly, the current will now almost flow through the second SCR.

In a case that a trigger voltage ($V_{t,SCR1}$) of the first SCR is higher than a sum of a holding voltage ($V_{h,SCR1}$) of the first SCR and a trigger voltage ($V_{t,SCR2}$) of the second SCR, that is, $V_{t,SCR1}>V_{h,SCR1}+V_{t,SCR2}$, an overall trigger voltage of the entire ESD clamp circuit 900 is equal to the trigger voltage ($V_{t,SCR1}$) of the first SCR. As a result, the overall trigger voltage of the stack SCRs composed of the first SCR and the second SCR will not exceed the trigger voltage of any composing SCR.

In an adverse case that a trigger voltage ($V_{t,SCR1}$) of the first SCR is lower than a sum of a holding voltage ($V_{h,SCR1}$) of the first SCR and a trigger voltage ($V_{t,SCR2}$) of the second SCR, that is, $V_{t,SCR1} < V_{h,SCR1} + V_{t,SCR2}$, an overall trigger voltage of the entire ESD clamp circuit 900 is approximately equal to a sum of the holding voltage ($V_{h,SCR1}$) of the first SCR and a trigger voltage ($V_{t,SCR2}$) of the second SCR, that is, $V_{h,SCR1} + V_{t,SCR2}$.

Figure 10:
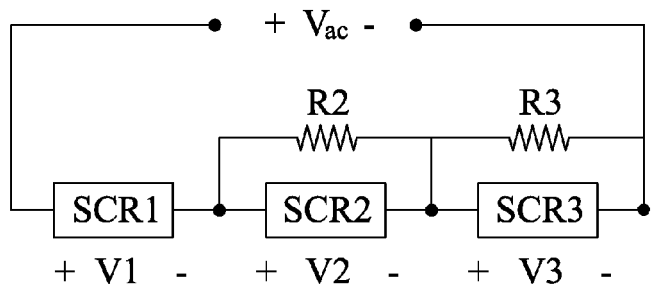
FIG. 10 shows an ESD clamp circuit implemented by stacking three SCRs according to one embodiment of the present invention.

FIG. 10 shows an ESD clamp circuit 1000 implemented by stacking three SCRs, that is, a first SCR (SCR 1), a second SCR (SCR 2) and a third SCR (SCR 3). The ESD clamp circuit 1000 also includes a shunt resistor $R_2$ associated and connected in parallel with the second SCR, and a shunt resistor $R_3$ associated and connected in parallel with the third SCR. In this embodiment of the present invention, the shunt resistor $R_2$ is larger than the shunt resistor $R_3$. In practice, the first SCR should satisfy a basic requirement that $V_{BD} > 1.2 V_{DD}$ such that low leakage can be maintained in a normal operation (i.e., non-ESD event).

To ensure that the second SCR and the third SCR can be triggered in turn immediately after the conduction of the first SCR, a second SCR and a third SCR with low trigger voltage should be utilized. Suitable SCRs with low trigger voltage are MLSCR and LVTSCR.

Upon conduction of the first SCR, a voltage approximately of a difference of a trigger voltage ($V_{t,SCR1}$) of the first SCR and a holding voltage ($V_{h,SCR1}$) of the first SCR, that is, $V_{t,SCR1} - V_{h,SCR1}$, is across the second SCR (provided that $R_2 \gg R_3$). When this voltage becomes higher than the trigger voltage ($V_{t,SCR2}$) of the second SCR, the second SCR is thus conducted and the resistance of the second SCR changes from high to low.

Upon conduction of the first SCR and the second SCR, a voltage approximately of $V_{ac} - V_{h,SCR1} - V_{h,SCR2}$ is across the third SCR. When this voltage becomes higher than the trigger voltage ($V_{t,SCR3}$) of the third SCR, the third SCR is thus conducted and the resistance of the third SCR changes from high to low. An overall trigger voltage of the entire ESD clamp circuit 1000 may be approximately equal to a sum of a holding voltage ($V_{h,SCR1}$) of the first SCR, a holding voltage ($V_{h,SCR2}$) of the second SCR, and a trigger voltage ($V_{t,SCR3}$) of the third SCR, that is, $V_{h,SCR1} + V_{h,SCR2} + V_{t,SCR3}$.

Figure 11:
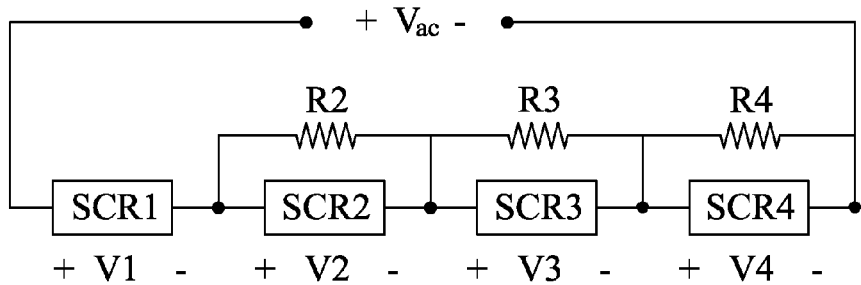
FIG. 11 shows an ESD clamp circuit implemented by stacking four SCRs according to one embodiment of the present invention.

FIG. 11 shows an ESD clamp circuit 1100 implemented by stacking four SCRs, that is, a first SCR (SCR 1), a second SCR (SCR 2), a third SCR (SCR 3) and a fourth SCR (SCR 4). The ESD clamp circuit 1100 also includes a shunt resistor $R_2$ associated and connected in parallel with the second SCR, a shunt resistor $R_3$ associated and connected in parallel with the third SCR, and a shunt resistor $R_4$ associated and connected in parallel with the fourth SCR. In this embodiment of the present invention, the relation of those shunt resistors is $R_2 > R_3 + R_4$, and $R_3 > R_4$. In practice, the first SCR should satisfy a basic requirement that $V_{BD} > 1.2 V_{DD}$ such that low leakage can be maintained in a normal operation (i.e., non-ESD event).

To ensure that the second SCR, the third SCR and the fourth SCR can be triggered in turn immediately after the conduction of the first SCR, a second SCR, a third SCR and a fourth SCR with low trigger voltage should be utilized. Suitable SCRs with low trigger voltage are MLSCR and LVTSCR.

Upon conduction of the first SCR, a voltage approximately of a difference of a trigger voltage ($V_{t,SCR1}$) of the first SCR and a holding voltage ($V_{h,SCR1}$) of the first SCR, that is, $V_{t,SCR1} - V_{h,SCR1}$, is across the second SCR (provided that $R_2 \gg R_3 + R_4$). When this voltage becomes higher than the trigger voltage ($V_{t,SCR2}$) of the second SCR, the second SCR is thus conducted and the resistance of the second SCR changes from high to low.

Upon conduction of the first SCR and the second SCR, provided that $R_3 > R_4$, when a voltage across the third SCR becomes higher than the trigger voltage ($V_{t,SCR3}$) of the third SCR, the third SCR is thus conducted and the resistance of the third SCR changes from high to low.

Upon conduction of the first SCR, the second SCR and the third SCR, a voltage approximately of $V_{ac} - V_{h,SCR1} - V_{h,SCR2} - V_{t,SCR4}$ is across the fourth SCR. When this voltage becomes higher than the trigger voltage ($V_{t,SCR4}$) of the fourth SCR, the fourth SCR is thus conducted and the resistance of the fourth SCR changes from high to low. An overall trigger voltage of the entire ESD clamp circuit 1100 may be approximately equal to a sum of a holding voltage ($V_{h,SCR1}$) of the first SCR, a holding voltage ($V_{h,SCR2}$) of the second SCR, a holding voltage ($V_{h,SCR3}$) of the third SCR and a trigger voltage ($V_{t,SCR4}$) of the fourth SCR, that is, $V_{h,SCR1} + V_{h,SCR2} + V_{h,SCR3} + V_{t,SCR4}$.

Generally speaking, an ESD clamp circuit may include n stacking SCRs, in a sequence from a first SCR to an n-th SCR. It is appreciated that the composing SCRs of the ESD clamp circuit may be the SCRs described in FIGS. 2A-6C, or may be other SCRs. The ESD clamp circuit also includes (n−1) shunt resistors, being associated and in parallel with (n−1) SCRs, respectively, in a sequence from the second to the n-th SCR.

To ensure that the n SCRs can be properly triggered in turn, in a sequence from the first SCR to the n-th SCR, resistances of the (n−1) shunt resistors monotonically decrease from a shunt resistor associated with the second SCR to a shunt resistor associated with the n-th SCR.

To be more specific, resistance of a shunt resistor with a given sequence number should preferably be greater than sum of resistances of shunt resistors with sequence numbers higher than the given sequence number. For example, regarding the ESD clamp circuit shown in FIG. 11, $R_2 > R_3 + R_4$.

Although specific embodiments have been illustrated and described, it will be appreciated by those skilled in the art that various modifications may be made without departing from the scope of the present invention, which is intended to be limited solely by the appended claims.

What is claimed is:

1. A silicon-controlled rectifier (SCR), comprising:
a first-type field, a second-type first field and a second-type second field formed in a first-type well, the first-type field, the second-type first field and the second-type second field being disconnected;
an entire first-type doped region formed within the first-type field;
a segmented second-type doped region formed within the second-type first field; and
a segmented first-type doped region formed within the second-type second field;
wherein ion dose of the entire first-type doped region is greater than ion dose of the first-type field, ion dose of which is further greater than ion dose of the first-type well; ion dose of the segmented second-type doped region is greater than ion dose of the second-type first field, ion dose of which is further greater than ion dose of the first-type well; and ion dose of the segmented first-type doped region is greater than ion dose of the second-type second field, ion dose of which is further greater than ion dose of the first-type well.

2. The SCR of claim 1, wherein the first-type is p-type and the second-type is n-type.

3. The SCR of claim 1, wherein the first-type field, the second-type first field and the second-type second field are disposed in sequence latitudinally.

4. The SCR of claim 1, wherein the second-type first field and the second-type second field are disconnected.

5. The SCR of claim 1, further comprising a polysilicon gate formed on the first-type well and disposed between the second-type first field and the second-type second field.

6. The SCR of claim 5, further comprising an additional first-type doped region disposed between the polysilicon gate and the second-type second field.

7. The SCR of claim 1, further comprising a shallow trench isolation (STI) formed within the first-type well and disposed between the second-type first field and the second-type second field.

8. The SCR of claim 1, further comprising an entire second-type doped region formed within the second-type second field.

9. The SCR of claim 8, wherein the entire second-type doped region is disposed between the segmented second-type doped region and the segmented first-type doped region, and is connected with the segmented first-type doped region.

10. The SCR of claim 8, wherein the segmented first-type doped region is disposed between the segmented second-type doped region and the entire second-type doped region, and is connected with the entire second-type doped region.

11. The SCR of claim 8, wherein ion dose of the entire second-type doped region is greater than ion dose of the second-type second field, ion dose of which is further greater than ion dose of the first-type well.

12. The SCR of claim 1, wherein the segmented second-type doped region comprises a plurality of doped sub-regions, at least some of which are separated by other doped sub-regions doped with opposite type.

13. The SCR of claim 1, wherein the segmented first-type doped region comprises a plurality of doped sub-regions, at least some of which are separated by other doped sub-regions doped with opposite type.

14. The SCR of claim 1, wherein the segmented second-type doped region comprises a plurality of doped sub-regions, at least some of which are separated by lightly-doped sub-regions doped with same type.

15. The SCR of claim 1, wherein the segmented first-type doped region comprises a plurality of doped sub-regions, at least some of which are separated by lightly-doped sub-regions doped with same type.

16. The SCR of claim 1, wherein two of the SCR are stacked, and a polysilicon region is connected between a cathode of a first SCR and an anode of a second SCR, the polysilicon region being utilized to trigger the second SCR.

* * * * *